United States Patent
Swanson et al.

(10) Patent No.: US 6,789,238 B2
(45) Date of Patent: Sep. 7, 2004

(54) SYSTEM AND METHOD TO IMPROVE IC FABRICATION THROUGH SELECTIVE FUSING

(75) Inventors: Leland Swanson, McKinney, TX (US); Gregory E. Howard, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 36 days.

(21) Appl. No.: 10/189,047

(22) Filed: Jul. 2, 2002

(65) Prior Publication Data

US 2004/0006755 A1 Jan. 8, 2004

(51) Int. Cl.⁷ .................. G06F 17/50; H01L 21/44
(52) U.S. Cl. .................. 716/4; 716/19; 716/1; 438/601
(58) Field of Search .................. 716/4, 1–3, 5–21; 438/601; 257/529, 538; 714/708, 733

(56) References Cited

U.S. PATENT DOCUMENTS

| | | | |
|---|---|---|---|
| 3,656,115 A | * 4/1972 | Foerster | 340/14.31 |
| 3,988,824 A | 11/1976 | Bodway | |
| 4,214,201 A | 7/1980 | Kern | |
| 4,595,881 A | 6/1986 | Kennan | |
| 4,812,745 A | 3/1989 | Kern | |
| 5,493,148 A | * 2/1996 | Ohata et al. | 257/538 |
| 5,757,264 A | * 5/1998 | Petit | 338/195 |
| 5,926,034 A | * 7/1999 | Seyyedy | 326/37 |
| 6,020,785 A | 2/2000 | Allen et al. | |
| 6,064,947 A | * 5/2000 | Sun et al. | 702/106 |
| 6,157,241 A | * 12/2000 | Hellums | 327/525 |
| 6,214,630 B1 | * 4/2001 | Hsuan et al. | 438/11 |
| 6,243,283 B1 | * 6/2001 | Bertin et al. | 365/63 |
| 6,346,847 B1 | 2/2002 | Capici et al. | |
| 6,366,154 B2 | 4/2002 | Pulvirenti | |
| 6,424,557 B2 | * 7/2002 | Camera et al. | 365/104 |
| 6,433,714 B1 | * 8/2002 | Clapp et al. | 341/121 |
| 6,493,414 B1 | * 12/2002 | Callahan | 377/69 |
| 6,505,324 B1 | * 1/2003 | Cowan et al. | 716/4 |
| 2002/0035718 A1 | * 3/2002 | Fukushima et al. | 716/11 |
| 2002/0062473 A1 | * 5/2002 | Tomioka | 716/4 |
| 2002/0123854 A1 | * 9/2002 | Engel et al. | 702/117 |
| 2003/0051199 A1 | * 3/2003 | Osada et al. | 714/733 |
| 2003/0062591 A1 | * 4/2003 | Jensen et al. | 257/529 |
| 2003/0065994 A1 | * 4/2003 | Kang et al. | 714/708 |

* cited by examiner

Primary Examiner—Vuthe Siek
Assistant Examiner—Magid Y. Dimyan
(74) Attorney, Agent, or Firm—W. Daniel Swayze, Jr.; W. James Brady; Frederick J. Telecky, Jr.

(57) ABSTRACT

A system and methodology for fabricating integrated circuits (ICs) on wafer die monitors at a subset of die one or more parameters that can affect the performance capabilities of associated ICs. One or more respective parameters for unmeasured die are derived based on one or more of the measured parameter. Fuses are selectively set for ICs at each die location based on parameters associated with each respective die location, thereby configuring the respective ICs accordingly.

28 Claims, 8 Drawing Sheets

SYSTEM AND METHOD TO IMPROVE IC FABRICATION THROUGH SELECTIVE FUSING

TECHNICAL FIELD

The present invention relates generally to systems and methods for fabricating integrated circuits (ICs) and more particularly to systems and methods for selectively setting fuses during IC fabrication.

BACKGROUND OF THE INVENTION

Numerous types of electronic devices employ electrical circuits implemented as one or more integrated circuits (ICs). ICs are configured to achieve desired functions, for example, control of associated devices, digital-to-analog (D/A) or analog-to-digital (A/D) conversion, mixed signal analysis, amplification etc. The particular use and performance of a given IC often is dictated by accuracies achieved during manufacture.

Several different parameters can affect the performance of ICs fabricated on wafer die. In analog amplifier circuits, for example, such parameters can include open loop gain and dominant pole locations within the circuits. Open loop gain is functionally related to resistor values, and dominant pole frequencies generally depend upon capacitors, resistors and transistor characteristics in the circuits.

By way of illustration, resistor values that can vary across a wafer include contributions from sheet resistance and head resistance. Lithography and etch based factors also can affect variations in the patterned width of the resistor, which can further vary the resistance. All of these factors can influence the open loop gain and/or dominant pole frequency of ICs, which ultimately affects device performance. For example, sheet resistance can vary by ten to twenty percent, and variations in head resistance can also vary by an additional ten to twenty percent. Such variations can result in large deviations in open loop gain and/or dominant pole frequencies.

These and other variations in circuit parameters further can vary across different die fabricated in the same wafer as well as between different wafer lots. Conventionally, variations in amplifier parameters are accounted for by compensating all circuitry fabricated on a wafer in a like manner, which often leads to overcompensation for many of the ICs. For example, one or more selected parameters can be measured at one location on a wafer, which measured parameter(s) are utilized as a basis for configuring all circuitry derived from the wafer. Fuses can be blown for each wafer die to provide compensation for each of the ICs based on the single measurement taken. Such an approach presumes uniformity across the wafer and usually sets fuses for all ICs based on the measurement, typically assuming a worst-case scenario for a maximum variation in parameter values.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a system and methodology for fabricating integrated circuits (ICs) on die spread across a wafer. One or more parameters that can affect the performance capabilities of the ICs are monitored at die locations. The monitored parameters are utilized to determine one or more respective parameters for unmeasured die locations, such as by interpolating parameters for measured die locations. Selective fusing can then be implemented to configure the associated ICs at die locations based on the parameters associated with respective die locations. For example, the fusing can be utilized to disconnect circuit elements (e.g., capacitors) as well as to enable circuit elements (e.g., resistors or inductors) in the ICs.

According to one aspect of the invention, a method is provided to facilitate fabrication of integrated circuits (ICs) on a wafer. The method includes measuring electrical characteristics associated with at least some of the die locations on the wafer and computing at least one respective parameter value based on at least some of the measured electrical characteristics. One or more respective parameter value for unmeasured die locations can be determined based at least in part on at least one of the parameter values computed for the measured die locations. Fuses then can be selectively set at the die locations based on one or more of the respective parameter values for the respective die locations to selectively configure ICs at the die locations.

According to another aspect of the present invention, a system is disclosed that facilitates fabrication of integrated circuits (ICs) on a wafer. The system includes a measurement system that monitors electrical characteristics at select die locations, such as at locations spaced apart and across the wafer, and that determines one or more parameters for the measured die locations. Corresponding parameters also are determined for unmeasured die locations based at least in part upon parameters associated with the measured die locations. A fuse system selectively sets fuses at the die locations based on one or more parameter values for the respective die location to selectively configure ICs at the respective die locations accordingly. For example, the fuse system can set fuses to modify die structure by connecting impedance elements (e.g., capacitors, inductors, or resistors) at a desired node of ICs on respective die locations, such as to improve performance characteristics of ICs based on the parameters associated with the respective die location.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

BRIEF DESCRIPTION OF THE DRAWINGS

FIG. 5 illustrates a table having grid blocks that contain parameters associated with measured die locations on a wafer, where the grid blocks have x-y coordinates and correspond to the die locations.

FIG. 6 illustrates a table having grid blocks that contain parameters associated with die locations on a wafer, where the grid blocks have x-y coordinates corresponding to the die locations.

DETAILED DESCRIPTION OF THE INVENTION

The present invention relates generally to systems and methods for fabricating an integrated circuit. A desired circuit configuration is achieved by selectively setting or blowing fuses in wafer die to reconfigure ICs (e.g., by modifying respective circuit components, such as capacitors, inductors, resistors or transistors) to provide desired circuit characteristics. For example, by establishing the capacitance (or other electrical circuit parameters) for ICs on each die based on parameters associated with each such die, performance characteristics can be improved or otherwise tailored for ICs on each respective die.

Figure 1:
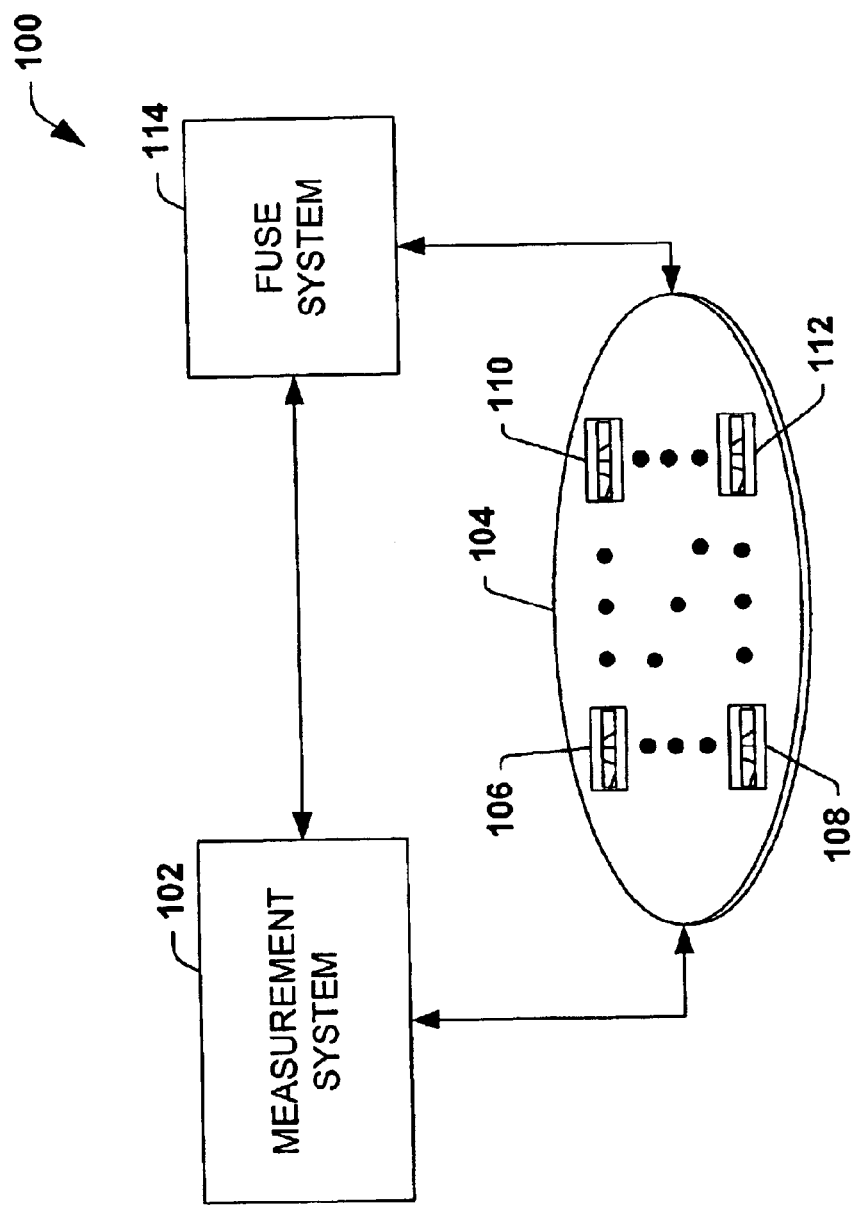
FIG. 1 is a schematic diagram illustrating a system for selectively configuring integrated circuits in accordance with an aspect of the present invention.

Turning to FIG. 1, a system 100 that can be employed in fabrication of an integrated circuit in accordance with an aspect of the present invention is illustrated. The system 100 includes a measurement system 102 operative to measure one or more circuit parameters at one or more locations on a wafer 104. According to a particular aspect of the present invention, the parameter measurements are obtained for a subset of a plurality of die locations 106, 108, 110, 112 on the wafer 104.

By way of example, in a wafer having about 20,000 die, the measurement system may obtain parameters at less than about one hundred (e.g., 10 to 30 locations) spaced apart die locations on the wafer 104. It is to be appreciated that the number of locations at which the measurements are taken may vary depending upon the number of die on the wafer 104 or based on variations in a parameter or set of parameters across the wafer. The parameters for which measurements can be obtained include, for example, sheet resistance of the wafer, head resistance, impedance, capacitance density in the wafer, transistor early voltage, transistor base resistance, parasitic capacitance and transistor ft. Those skilled in the art will appreciate that a subset of one or more of such parameters as well as including other parameters associated with an integrated circuit or a wafer on which the ICs are being fabricated can also be used in accordance with an aspect of the present invention.

The measurement system 102 employs the parameter values obtained for the subset of possible die locations to determine corresponding parameter values for the other (e.g., unmeasured) die locations. For example, the measurement system 102 can interpolate between known parameter values, which can include measured and/or recently determined but unmeasured die locations, to approximate parameter values at remaining die locations. The measurement system can generate a two-dimensional map of parameter values associated with each die location on the wafer, including both measured and computed values. Those skilled in the art will understand and appreciate various approaches that can be employed to ascertain parameter values for unmeasured die locations in accordance with an aspect of the present invention.

The measurement system 102 cooperates with a fuse system 114 to selectively set (e.g., open or blow) one or more fuses located in the wafer die based on the measurements obtained by the measurement system. For example, each of the die can include a plurality of fuses associated with respective circuit components. In one particular example, fuses can be connected in series with respective circuit components (e.g., capacitors), which series combinations are connected in parallel at a node of each respective integrated circuit of the associated die. Setting fuses for each die thus operates to selectively configure the ICs of each respective die based on how the circuitry is modified in response to setting such fuses. For example, a selected set of one or more fuses can be set for a given die to remove one or more associated capacitors or other electrical components from the ICs of such die. This results in a corresponding change in capacitance (or other electrical characteristic) for the ICs in the respective die, such as at a node to which the modified network is coupled. In an alternative approach according to an aspect of the present invention, fuses can be connected to short across resistors, such that setting fuses can enable resistors to be connected in to the circuitry (e.g., as part of a gain trimming process for an amplifier based on sheet and/or head resistance parameters). Thus, those skilled in the art will understand and appreciate that die structures can be modified by selective fusing, according to an aspect of the present invention, to modify other electrical characteristics of ICs.

Conventionally, parameters, including capacitance density, were assumed to be uniform across the wafer 104. With this assumption, fuses usually are set across the entire surface of a wafer according to a worst-case scenario for the parameters. This approach, however, often results in overcompensation and hence, lower circuit performance.

In accordance with an aspect of the present invention, the fuse system 114 sets fuses for a given die based on the parameter values associated with that die, which parameter values can be measured or computed from the measured parameter values. For the particular example of an amplifier circuit, a capacitance density can be ascertained for each die on the wafer, such as based on actual measured parameter values or computed parameter values. Because the capacitance density is determined for each die, a proper capacitance structure area can be determined to provide a desired (e.g., the optimal) capacitance at a high impedance node of the amplifier in the ICs and the appropriate fuses can be set accordingly. Additionally or alternatively, other electrical characteristics (e.g., amplifier gain) can be configured by setting other fuses accordingly.

As mentioned above, the fuse system 114 selectively sets fuses at die locations 106–112 where measurements were not taken (e.g., unmeasured die locations) based on parameter values obtained by the measurement system 102 at measured locations on the wafer 104. In particular, the measured values are utilized (e.g., via interpolation, mapping, signature generation, or otherwise) to ascertain respective values for the parameter at unmeasured die locations on the wafer. While the computation of unknown parameter values was described above as being performed by the measurement system, it is to be understood and appreciated that this computation could be made by the fuse system or some external system (not shown) according to an aspect of the present invention. Either of the measurement system 102 and/or the fuse system 114 can also, alone or in conjunction with other systems, utilize the parameter values to determine the respective arrangements of fuses to set. These determinations can, for example, be performed by one or more processors and memory included within the measurement system 102 and/or fuse system 114.

By way of further example, the parameter values may be utilized to develop or populate respective truth tables corresponding to the different die locations on the wafer, where a given truth table governs which fuses the fuse system is to set for an associated die location. By setting selected fuses for a given die location based on parameters for that location, a desired capacitance (e.g., at a high impedance node of an analog amplifier circuit) or other circuit parameters can be set for ICs at such die location to provide dominant poles operative to mitigate IC instability, enhance performance and can also lower distortion at higher frequencies.

It is to be further appreciated that subsequent manufacturing decisions, such as die cutting, packaging and/or labeling, can be made according to respective performance capabilities of ICs. The performance capabilities of the ICs can be determined from the parameter values for the respective die on each wafer. For instance, die can be labeled, separated from wafers, and/or packaged based on their determined performance capabilities. For example, die comprising ICs that have tighter specifications, and thus which have high performance capabilities, can have their fuses set more aggressively so as to operate with improved performance characteristics. During fabrication, ICs can be identified according to their performance characteristics. Then, later in the fabrication process, ICs can be labeled commensurate with their identified performance characteristics. That is, ICs identified as high performance can be labeled as an aggressive product line. Additionally, or in the alternative, lower performance ICs from the same wafer or different wafer lots can have their fuses set less aggressively and, in turn, be identified and subsequently labeled as less aggressive product lines. Still another alternative is that certain die not meeting certain minimum criteria can be inked or marked out.

By way of further illustration, the identification of the ICs as corresponding to a particular product line or as having a particular performance capability can be tracked within software files mapped to die within wafers and/or wafer lots. Thus, a single wafer can result in ICs having multiple levels of performance, which can in turn be sold and distributed as different products at different prices. In this way, manufacturers can identify ICs performance with greater particularity and mitigate confusion as to performance capabilities of certain ICs. This can help maximize profits from ICs fabricated on portions of wafers having more desirable parameter values, as higher performance ICs from the same wafer can be identified and sold at a premium relative to lower performance ICs.

Figure 2:
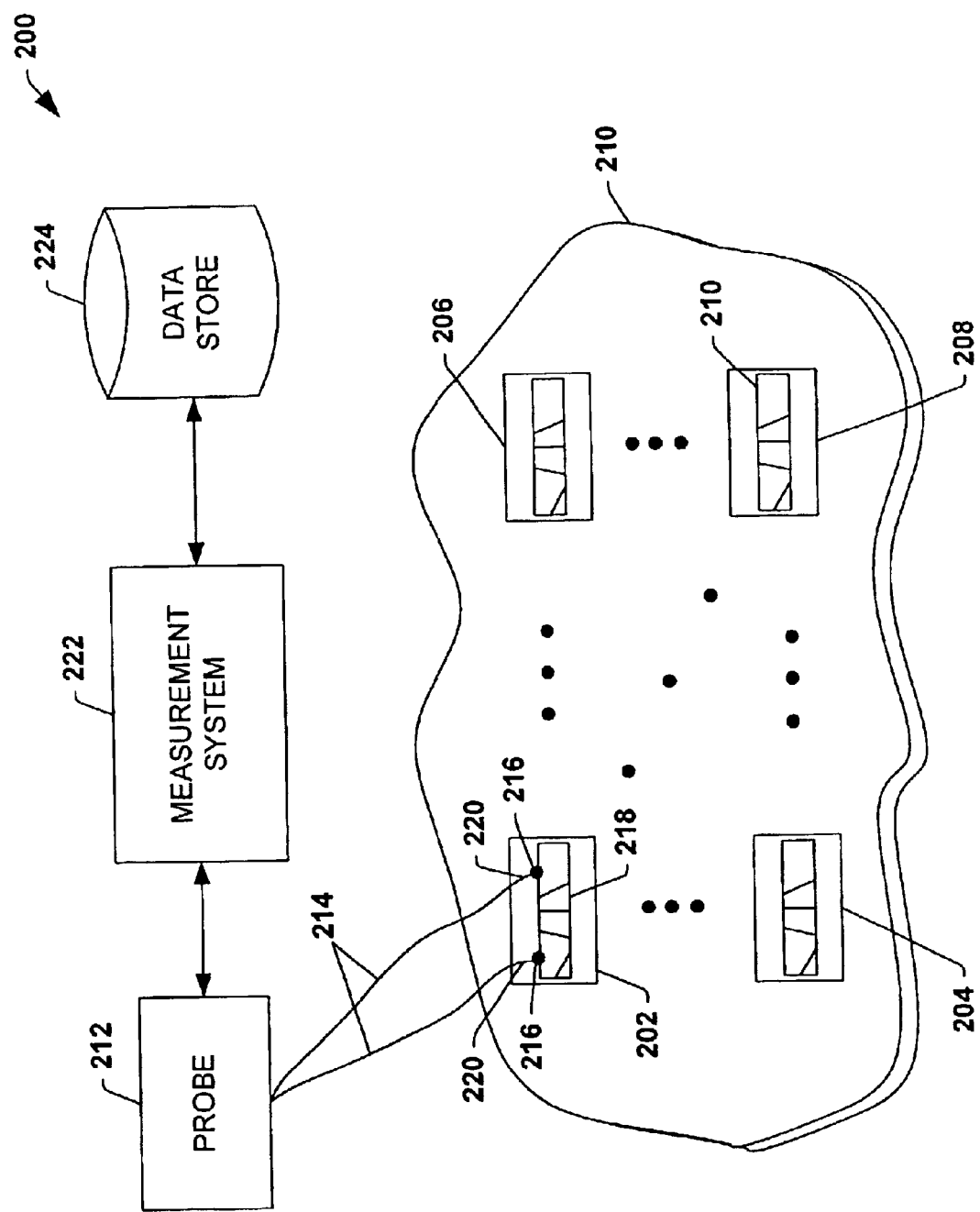
FIG. 2 is a schematic diagram illustrating a system for monitoring or detecting circuit parameters in accordance with an aspect of the present invention.

FIG. 2 is a schematic block diagram illustrating a system 200 for measuring parameter values for one or more of a plurality of die 202, 204, 206, 208 on a wafer 210 in accordance with an aspect of the present invention. The system 200 includes a probe 212 operative to measure electrical and/or physical characteristics of selected die on the wafer 210. For example, the probe 212 includes electrical leads 214 that connect (electrically or otherwise) to terminals or leads 216 of the die 202–208 to interrogate one or more ICs at the respective die to ascertain corresponding parameter values. For purposes of simplicity of explanation, the wafer 210 is depicted as broken away so as to present an enlarged view of die 202–208 on the wafer. Each of the die 202–208 includes respective ICs 218 formed thereon.

The probe 212 can be a multi-tipped probe, for example, for testing one or more circuit elements in a die. Tip portions 220 of the probe may be tapered points of tungsten wires, for example, that facilitate stable electrical contact with leads (or terminals) 216 of die 202–208 and/or ICs 218 formed thereon. It is to be appreciated that, for purposes of the present invention, any number of probes having any number and types of tips and wires can be utilized to contact any number of leads for testing, concurrently or consecutively, any number of electrical characteristics associated with ICs formed on die dispersed across one or more wafers or wafer lots. Those skilled in the art will understand and appreciate various commercially available and proprietary probe systems that could be utilized to implement such measurements.

The system 200 also includes a measurement system 222 associated with the probe 212 and adapted to receive one or more signals from the probe 212 indicative of the one or more electrical characteristics detected by the probe. The probe and measurement system can be part of an integrated measurements system. The measurement system 222 utilizes the information from the probe 212 to ascertain respective values of one or more parameters for ICs at the probed die locations on the wafer 210. In accordance with an aspect of the present invention, the probe (or a plurality of probes) 212 obtain measurements at a plurality of spaced apart die locations 202–208 for which parameter values are determined. The locations can be selected to obtain an indication of how wafer (or die) characteristics vary across the surface of the wafer and thus can be selected to sample wafer characteristics at generally evenly spaced apart die locations across the wafer surface. The number and location of die measurements can vary based on the number of die on the wafer as well as cost considerations associated with added equipment or time in making such measurements. The measurement system 222 may also function to control the number, type, duration, etc. of readings taken by the probe 212.

In accordance with an aspect of the present invention, the probe can be used to obtain information at a small percentage (e.g., less than one percent) of the number of die locations. For example, for a wafer having about 20,000 die, about 10–30 measurements at generally evenly spaced apart die locations across the wafer surface should be a sufficient sampling from which parameter values for the remaining die locations can be ascertained. Of course, measurements can be taken at a greater number of die locations to improve the accuracy of the parameter values.

The measurement system 222 also can be programmed and/or configured to determine respective parameter values for unmeasured die locations on the wafer 210 according to an aspect of the present invention. The parameter values for the unmeasured die locations can be determined by examining and mathematically manipulating the data obtained from the measured die locations (e.g., via interpolation, surface function mapping, or the like) as well as based on the parameter values previously determined for unmeasured die locations. It is to be appreciated that these computations can be performed by the probe system, the measurement system, other associated systems (not shown), or any combination thereof.

Respective parameter values for the various die locations on the wafer can be utilized to derive respective signatures indicative of relationships between the parameters at various locations on the wafer. Respective parameter values and/or signatures derived therefrom can be utilized to generate fuse data, such as by populating a truth table, which dictates which of a plurality of fuses should be set for a given die to obtain a desired circuit condition for each IC in that die.

For the example of an amplifier circuit, a parallel arrangement of fuses in series with respective capacitors can be provided at a high impedance node of the ICs 218. The truth table can be populated to identify which fuses to set for each given die 202 to provide a desired capacitance value at the high impedance nodes of the ICs 218 in each respective die (e.g. based on the capacitance density and the area needed to achieve the desired capacitance). By setting fuses at respective die locations on the wafer 204 a desired capacitance can be established at the high impedance node to set dominant poles at appropriate locations according to an aspect of the present invention. This can mitigate IC instability and improve performance of the ICs across the wafer.

It is to be appreciated that the measurement system 222 can perform signature generation, truth table population and/or parameter value derivations for unmeasured die locations (e.g., implemented by one or more processors and memory included therein). Alternatively, one or more separate systems (not shown) may perform these operations independently. Truth tables, as well as other information, such as, for example, respective parameter values and/or signatures corresponding to the parameter values can be stored within a data store 224 associated with the measurement system. Those skilled in the art will understand and appreciate that various techniques and data structure types can be utilized to store parameter values and, in turn, to derive unknown parameter values from the stored values.

By way of example, the data store 224 can store data for each of a plurality of die locations in a table indexed by x-y coordinates corresponding to the respective die locations. Each x-y coordinate can store respective values of a plurality of parameters associated with die on a wafer. According to one or more aspects of the present invention, the parameters pertain to electrical characteristics that can affect the performance of ICs being fabricated (e.g., sheet resistance, head resistance, impedance, capacitance density, transistor early voltage, transistor base resistance, parasitic capacitance, transistor ft). The parameters can be directly measured by the measurement system. Alternatively or additionally, some (or all) of the parameter values can be computed or inferred based on the measurement data obtained via the probe 212.

Figure 3:
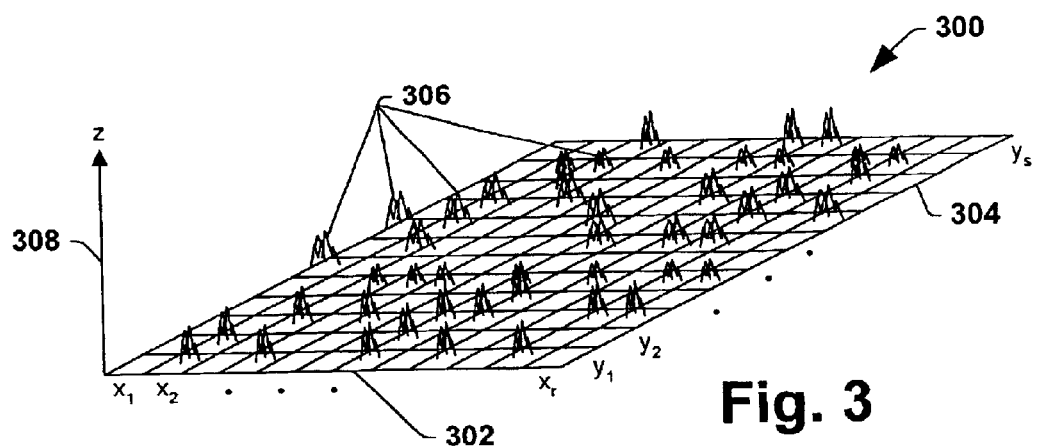
FIG. 3 illustrates an example of a three-dimensional surface mapping representation of one or more parameters associated with a subset of die locations on a wafer.

FIG. 3 illustrates an example of a three-dimensional surface mapping representation 300 of one or more parameters associated with discrete die locations on a surface of a wafer, such as can be employed to facilitate setting fuses in accordance with an aspect of the present invention. As mentioned above, the parameters can be measured values or be computed based on parameter, including measured die locations and previously determined die locations. In this example, die locations of the wafer surface are mapped onto grid blocks, which are plotted along an x-axis 302 and a y-axis 304 in the three-dimensional coordinate system. The x-axis 302 is depicted as including up to r units and the y-axis 304 includes up to s units (r and s being positive integers) to define a corresponding surface of the wafer.

Respective parameter values for the die locations are represented by plots 306 extending along a z-axis 308 relative to a plane in the x-y coordinate system. The plots 306 represent parameters as a series of interconnected curves or functional form indicative of parameter values at a subset of die locations. For example, the parameters are represented as a signature plot at each of the measured die locations, where the signature plot corresponds to a functional representation of values and interrelationships of one or more parameters measured at the respective die locations. Signatures can represent relationships between one or more parameters that can affect the stability of ICs. Alternatively, the plots could represent parameters separately (e.g., as discrete values) at the respective die locations. It is to be appreciated that any number of die locations can be measured and represented on the grid map. It is to be further appreciated that any number of desired parameters can be measured at the die locations, which parameters may vary according to the type of ICs being fabricated and performance requirements.

Figure 4:
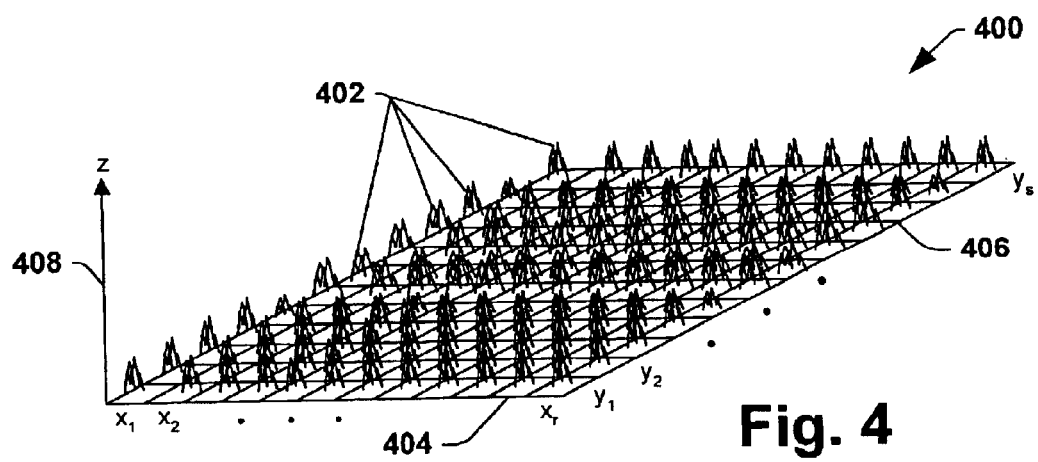
FIG. 4 illustrates an example of a three-dimensional surface mapping representation of one or more parameters associated with discrete die locations on a wafer.

FIG. 4 depicts a graphical representation 400 of die locations mapped to a grid similar to that illustrated in FIG. 3, except that the representation includes plots 402 of parameter for each of the die locations. The representation includes x-, y- and z-axes 404, 406 and 408, respectively. As with FIG. 3, the parameter values are represented by the curves or functional form of the respective plots 402 extending in a z direction at respective die locations. It is to be appreciated that the values present in plots 402 corresponding to unmeasured die locations are derived based on the parameter data for measured die locations as well as from previously determined unmeasured die locations. Various approaches can be utilized to ascertain the parameter plots for unmeasured die locations, such as, for example, interpolation from data associated with the nearest neighboring grid blocks corresponding to measured (or unmeasured, but recently determined) die locations.

Figures 5, 6:
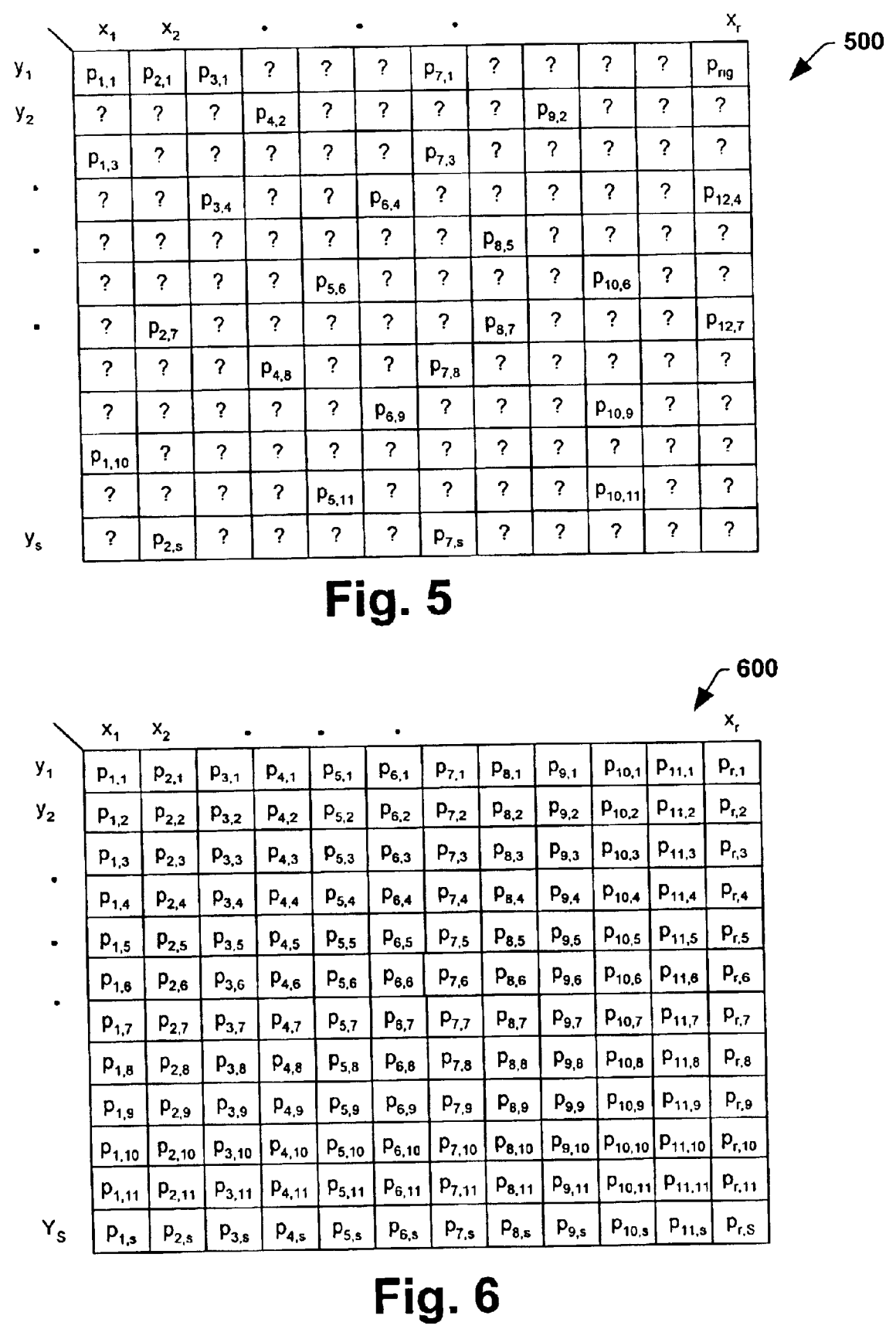

FIG. 5 illustrates a table 500 representing parameter values similar to the graphical representation depicted in FIG. 3, which table is indexed by x-y coordinates that correspond to the die locations on the wafer (e.g., to r units in the x direction and to s units in the y direction, where r and s are positive integers). Respective values of one or more parameters measured at different die locations are entered into corresponding blocks of the table. By way of illustration, entry $P_{8,7}$ represents the value of one or more parameters obtained for the die location on the wafer 8 units out in the x direction and 7 units out along the y direction. Blocks corresponding to die locations where no measurements were taken are indicated by question marks "?" for purpose of simplicity of illustration.

FIG. 6 depicts a table 600 similar to that illustrated in FIG. 5, wherein respective values of one or more parameters P are stored within a table mapped to die locations on a wafer (e.g., to r units in the x direction and to s units in the y direction, r and s being positive integers). However, unlike FIG. 5, values for the one or more parameters are present for each of the die locations, including the unmeasured die locations. By way of example, entry $P_{9,3}$ represents the value of one or more parameters obtained for the die location on the wafer 9 units out in the x direction and 3 units out along the y direction. As described above with respect to FIG. 4, it is to be appreciated that values for blocks corresponding to unmeasured die locations can be ascertained in any of a variety of manners according to an aspect of the present invention.

Table 1 illustrates an example of data that can be utilized to control which of a plurality of fuses to set to achieve desired operating characteristics for ICs at respective die locations on a wafer in accordance with an aspect of the present invention. For example, Table 1 is populated with binary data to designate which fuses to set to connect or disconnect components relative to ICs at the respective die locations (e.g., a value of 1 corresponds to opening or blowing an associated fuse, whereas a 0 corresponds to not opening the associated fuse).

TABLE 1

|       | $F_1$ | $F_2$ | ... | $F_{m-1}$ | $F_m$ |
|-------|-------|-------|-----|-----------|-------|
| $D_1$ | 1 | 0 | ... | 0 | 1 |
| $D_2$ | 1 | 0 | ... | 1 | 0 |
| ...   | ... | ... | ... | ... | ... |
| $D_{n-1}$ | 1 | 0 | ... | 0 | 1 |
| $D_n$ | 0 | 1 | ... | 0 | 1 |

In analog amplifier ICs, for example, Table 1 can be populated to establish the required desired capacitance structure area at respective high impedance nodes of the ICs according to one or more aspects of the present invention. Additionally, or alternatively, Table 1 can be used to identify a set of fuses (e.g., from zero to plural fuses) associated with a resistive structure on the IC, which can be set to trim the gain of the amplifier on each of the ICs based on the parameters measured at a subset of die locations on the wafer. Table 1 includes a plurality of columns, for example, corresponding to a number of fuse/capacitor sets, indicated at $F_1$–$F_m$, and a plurality of rows corresponding to the number of die locations on a wafer, indicated at $D_1$–$D_m$. It will be appreciated that each fuse could have more than one associated capacitor, although having a predetermined capacitance when connected into the associated IC. In the example illustrated in Table 1, entries within each row represent a parallel capacitor string for an associated die.

The values of entries within Table 1 govern which fuses to set, and thus defines the capacitance area for ICs at each of the die locations. In an analog amplifier IC, for example, by selectively removing capacitors from parallel capacitor arrangements, different capacitance areas can be established at high impedance nodes of ICs formed within respective wafer die such that the value of the capacitance is uniform across the wafer and from lot-to-lot. By way of illustration, in Table 1, the $F_1$ and $F_m$ entries within row $D_1$ are 1, while the $F_2$ and $F_{m-1}$ are 0. This would cause the fuses associated with $F_1$ and $F_m$ to be opened or set and fuses associated with $F_2$ and $F_{m-1}$ at this corresponding die location to remain unaffected and shorted. As such, the capacitors in series with fuses $F_1$ and $F_m$ will be removed from the parallel arrangement at the high impedance node for die location $D_1$ and capacitors in series with fuses $F_2$ and $F_{m-1}$ would remain connected in parallel at the high impedance node. Other fuses (including those represented by the ellipsis in Table 1) would be set in a similar manner.

It is to be appreciated that, for purposes of the present invention, different capacitor structures associated with different fuses can have the same or different areas. By providing different available capacitance values, more accurate capacitance values can be achieved by selectively combining capacitors in a desired manner. It is further to be appreciated that because of different possible capacitance density and/or other parameters across the wafer, either similar or different capacitance values might be achieved at different die on a wafer even though different fuses or sets of fuses are set for ICs at different die sites.

Those skilled in the art will understand that a table, such as Table 1, can be populated with fuse data in any of a variety of ways based on parameter values, the particular circuit being fabricated and its intended application. For instance, capacitance values can be mathematically or algorithmically determined based on stored parameter values (e.g., zero order equations) so as to mitigate instability in ICs. Then, based on the capacitance determined, an associated algorithm can determine which fuses should be opened to provide the desired capacitance area at high impedance nodes of the ICs for each die location. Table 1 can then be populated with fuse data to indicate which fuses are to be opened and which fuses are to remain closed (e.g., binary 1's and 0's). Alternatively, pre-populated fuse data could be generated for a given IC in advance of fabrication, such that selected fuse data could be accessed to achieve a desired level of performance for ICs at each die location based on the parameters associated with each respective die location.

Figure 7:
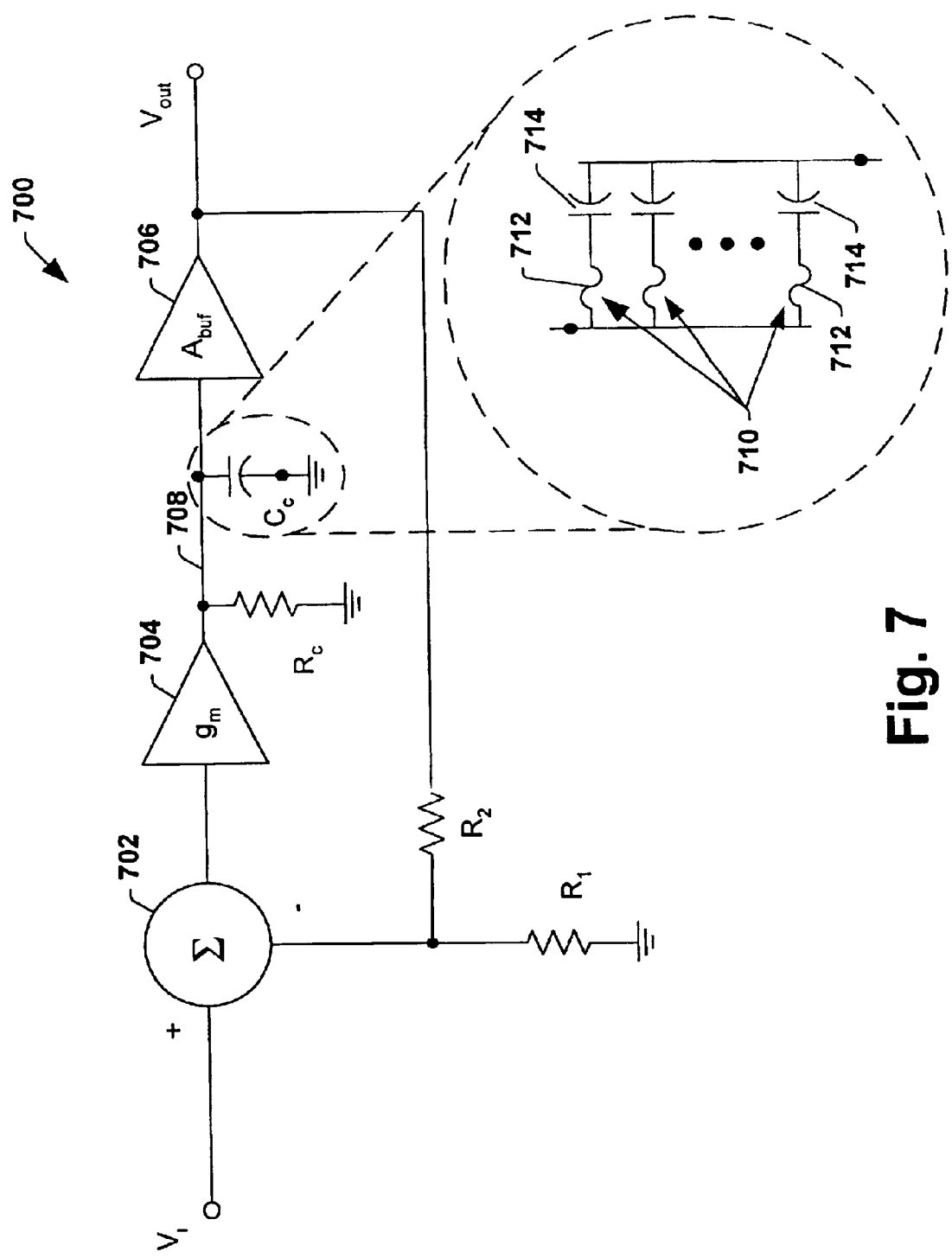
FIG. 7 depicts an example of a voltage feedback operational amplifier, such as may be implemented as an IC on a wafer in accordance with an aspect of the present invention.

FIG. 7 depicts an example of a typical voltage feedback operational amplifier 700 in a non-inverting condition, such as may be implemented as an IC on a wafer. The amplifier 700 receives an input voltage $V_i$ at a positive input of a summer 702. The summer 702 also receives a negative feedback signal by a gain setting resistors $R_1$ and $R_2$. $R_1$ is coupled between a negative input of the summer 702 and ground and resistor $R_2$ coupled between an output $V_{out}$ of the amplifier 700 and the negative input of the summer. The summer output feeds a transconductance stage 704 having a gain $g_m$, such as determined by gain setting resistor (not shown). The transconductance stage 704 feeds an output buffer 706, which has a gain $A_{buf}$ usually near unity (e.g., about 0.99).

The output of the transconductance stage 704 defines a high impedance (high Z) node 708 of the amplifier 700. An RC network is provided at the high Z node 708, including a resistance $R_c$ and a capacitance $C_c$. The capacitance $C_c$ is defined by a plurality of parallel fuse-capacitor strings 710, as depicted in an enlarged partial view from the amplifier 700. In part, the capacitance $C_c$ corresponds to a compensation capacitance that can be set to mitigate instability in the circuit. Each fuse-capacitor string 710 includes a fuse element 712 and one or more capacitors 714 connected in series between the high Z node and ground, for example. The fuses thus can be selectively set to provide a parallel combination of capacitors having an aggregate capacitance, which corresponds to the capacitance $C_c$ at the high Z node in accordance with an aspect of the present invention. As described herein, the capacitance $C_c$ is established to improve performance of the amplifier circuit.

The dominant pole frequency for the amplifier topology illustrated in FIG. 7 can be expressed as:

$$f_p = \left[\frac{1 + g_m R_c A_{buf}}{2\pi R_c C_c}\right]\left[\frac{R_1}{R_1 + R_2}\right] \quad \text{Eq. 1}$$

where
  $g_m$=transconductance;
  $R_c$=resistance of the high Z node;
  $C_c$=capacitance at the high Z node;
  $R_1$, $R_2$=Closed loop gain setting resistors; and
  $A_{buf}$=gain of the output buffer.

The gain bandwidth product (also known as the unity gain bandwidth) of such a circuit topology can be expressed:

$$GBWP = \frac{g_m A_{buf}}{2\pi C_c} \quad \text{Eq. 2}$$

For a simple differential amplifier input, the transconductance $g_m$, can be expressed as:

$$g_m \approx \frac{h_{fe}}{(h_{fe} - 1)R_{gm} + r_\pi},\quad \text{Eq. 3}$$

where
 $R_{gm}$=A circuit level $g_m$ setting resistor placed in the layout;
 $r_\pi = h_{ie}$=small signal emitter-base resistance; and
 $h_{fe}$=small signal transistor current gain.

From Eqs. 2 and 3, it follows that operational amplifiers are to be stable for unity gain (unity gain stable) and, hence, are to have a controlled GBWP, which can be expressed as follows:

$$GBWP \approx \frac{A_{buf}}{2\pi C_c} \frac{h_{fe}}{[(h_{fe} - 1)R_{gm} + r_\pi]} \quad \text{Eq. 4}$$

From the above, it is to be appreciated that for an amplifier IC, $C_c$ can be set to produce the desired GBWP based on knowledge of $A_{buf}$, $h_{fe}$, $R_{gm}$, and $r_\pi$. According to an aspect of the present invention, these and other parameters can be ascertained from measurements using readily available test systems.

In operational amplifiers that are not intended to be unity gain stable, it is important to control the location of the dominant pole frequency, which can be expressed as follows:

$$f_{pole} \approx (2\pi R_c C_c)^{-1}\left[1 + \left\{\frac{R_c A_{buf} h_{fe}}{((h_{fe} - 1)R_{gm} + r_\pi)}\right\}\left(\frac{R_1}{R_1 + R_2}\right)\right] \quad \text{Eq. 5}$$

However, it is also to be appreciated that, $$R_c \approx \left(\frac{V_A R_e}{V_T}\right)_{NPN} \| \left(\frac{V_A R_e}{V_T}\right)_{PNP} \quad \text{Eq. 6}$$

where
 $V_A$=transistor early voltage;
 $V_T$=thermal voltage=

$$\frac{kT}{q} \approx 26 \text{ mV@}300°\text{ K}$$

where
 k=Boltzmann's constant=$1.38\times10^{-23}$ joules/Kelvin,
 T=the absolute temperature in Kelvins, and
 q=the magnitude of electronic charge ($1.602\times10^{-19}$ coulomb;
 $R_e$=the degeneration resistance; and
 The subscripts NPN, PNP denote that values inside parenthesis pertain to the NPN or PNP type transistors.

From Eq. 6, it further will be appreciated that, with the additional knowledge of $V_A$, $R_e$, and $$\left(\frac{R_1}{R_1 + R_2}\right),$$

$C_c$ can be set given the desired $f_{pole}$. For an operational amplifier IC being fabricated, a desired value of $C_c$ can be set by selectively setting one or more fuses. Thus, desired operating characteristics can be achieved by setting fuses for each of a plurality of die locations based on parameters measured at a subset of die locations according to an aspect of the present invention. It will be appreciated that ICs at different die locations can have different levels of performance based on their associated parameter values and how fuses are set for the respective die.

Figure 8:
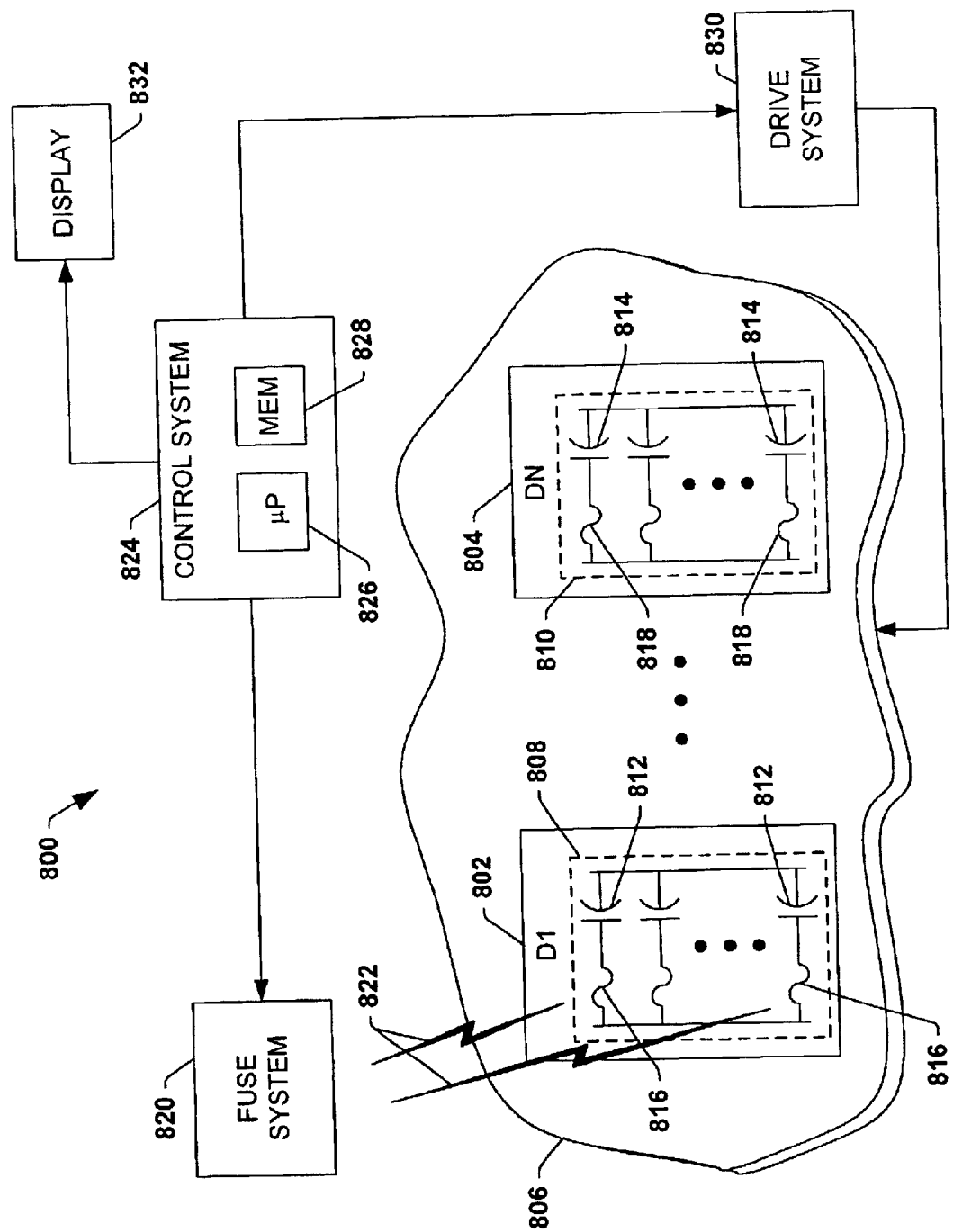
FIG. 8 is a schematic block diagram illustrating a system for fabricating ICs on die on a wafer according to an aspect of the present invention.

FIG. 8 is a schematic block diagram illustrating a system 800 for setting fuses associated with ICs on wafer die according to an aspect of the present invention. A plurality of die 802 and 804 are disposed at spaced apart locations on a wafer 806, each die including one or more ICs, schematically represented at 808 and 810. For simplicity of illustration, the wafer 806 is depicted as broken away to represent an enlarged view of the die on the wafer. Also, details of the ICs 808 and 810, other than capacitive fusing arrangements, have been omitted for purposes of brevity.

Each IC 808, 810 includes a plurality of capacitors 812 and 814 connected in series with respective fuses 816 and 818, which series combinations are connected in parallel for each IC. Those skilled in the art will understand and appreciate other arrangements of fuses, capacitors and/or other circuit components (e.g., impedance elements, such as inductors or resistors) that could be implemented in ICs in accordance with an aspect of the present invention. A fuse system 820 is operative to selectively set fuses 816 and 818 so as to connect (or disconnect) associated capacitors 812 and 814 from the parallel arrangement. The fuse system 820 may, for example, pulse selected fuses with a beam of light (e.g. a laser beam) 822 to set appropriate fuses, such as part of a laser trim process. Alternatively, the fuse system 820 can provide electrical energy to the respective die to set the fuses accordingly. Thus, capacitors 812 and 814 in series with fuses 816 and 818 that are opened by the fuse system 820 can be removed from the arrangement of parallel capacitors. In this manner, the fuse system is operative to establish a capacitance for ICs according to the resulting arrangement of parallel capacitors for the respective ICs. This capacitance value can be provided, for example, to a high impedance node of an analog amplifier IC to mitigate instability in the circuit and improve performance characteristics.

The fuse system 820 can operate to set appropriate fuses at respective die locations based on parameter values for the respective die. To accomplish this, the fuse system 820 is operatively coupled to a control system 824 that controls or regulates various portions of the system 800 as described herein (e.g., based on measured values as described above with respect to FIGS. 1 and 2).

By way of example, the control system 824 includes a processor 826, such as a microprocessor or CPU, coupled to a memory 828. The control system 824, and more particularly the memory 828, may be programmed/and or configured in any suitable manner to enable the processor 826 to implement desired control functionality and operate the various components within the system 800.

The memory 828 stores, for example, program code that can be executed by the processor 826 for carrying out operating functions of the system as described herein. The memory 828 also can store data in any suitable data structure (e.g., tables, lists, arrays, and so forth) based on which the fuse system can set desired fuses 816, 818 for ICs 808, 810 at each (or at least a plurality) of the die locations. As described above, a fuse data table can be populated based on parameter values associated with respective die locations. Parameter values for unmeasured die locations can be derived from a selected subset of measured die locations, such as by interpolating between parameter values of neighboring die locations having associated parameter values. It is to be appreciated, however, that neighboring die locations from which the interpolation is performed can also include both measured and unmeasured die locations for which parameter values have already been computed. Further, it may be desirable to utilize parameters associated with at least one measured die location in each interpolation. The interpolation can be a two-dimensional interpolation and can weigh parameters based on the relative distance between neighboring die locations and the die location for which parameters are being computed.

The memory 828 may include read only memory (ROM) and random access memory (RAM). The RAM is the main memory into which the operating system and application programs are loaded. The memory also serves as a storage medium for temporarily storing information such as target parameter values, target signature values, coordinate tables, patterns against which observed data can be compared, and algorithms that may be employed in carrying out one or more aspects of the present invention, for example. For mass data storage (e.g., the data store as described above with respect to FIGS. 2–6), the memory may further include a hard disk drive or other appropriate storage device. It further will be appreciated that the control system 824 could be implemented as part of the fuse system 820.

The system 800 also can include a load and/or drive system 830 coupled to the control system 824. Such a drive system 830 can position the wafer 806 (e.g., via a support spindle, not shown) to a desired position relative to the fuse system 820, such as based on control information from the control system 824. The drive system 830 may, for example, incrementally move the wafer 806 relative to the fuse system 820 so that fuses 816, 818 can be selectively set for respective die. Additionally, or in the alternative, the fuse system 820 may have its own associated drive system (not shown), for example, to facilitate positioning a laser or other fuse setting tool relative to select die in order to set selected fuses.

The system 800 further may include a display 832 operatively coupled to the control system 824 to display a representation (e.g., graphical and/or textual) of one or more process conditions. For example, the display 832 might provide a graphical and/or textual indication of which fuses are being set at which die site. Additionally or alternatively, the display 832 can provide an indication of parameter values at respective die locations as well as performance criteria associated with the ICs based on the parameter values (e.g., anticipated IC performance characteristics) at each respective die location. It is to be appreciated that the control system 824 can operate the various components of the system 800 to achieve the results described herein.

By way of example, the control system 824 can utilize measured parameters to determine which fuses 816, 818 to set and then cooperatively actuate the fuse system 820 in conjunction with the drive system 830 to set select fuses. The control system 824 can also simultaneously present relevant information on the display 832. It is to be further appreciated that the control system 824 can also be implemented to govern the number and/or location, etc. of tests performed on a wafer, such as by a probe or other test equipment as discussed with respect to FIG. 2. Additionally, the control system 824 can also control a measurement system as shown and describe with respect to FIGS. 1 and 2, particularly with regard to converting probed data into useful parameter information and controlling how measurements are obtain for respective die locations.

Figure 9:
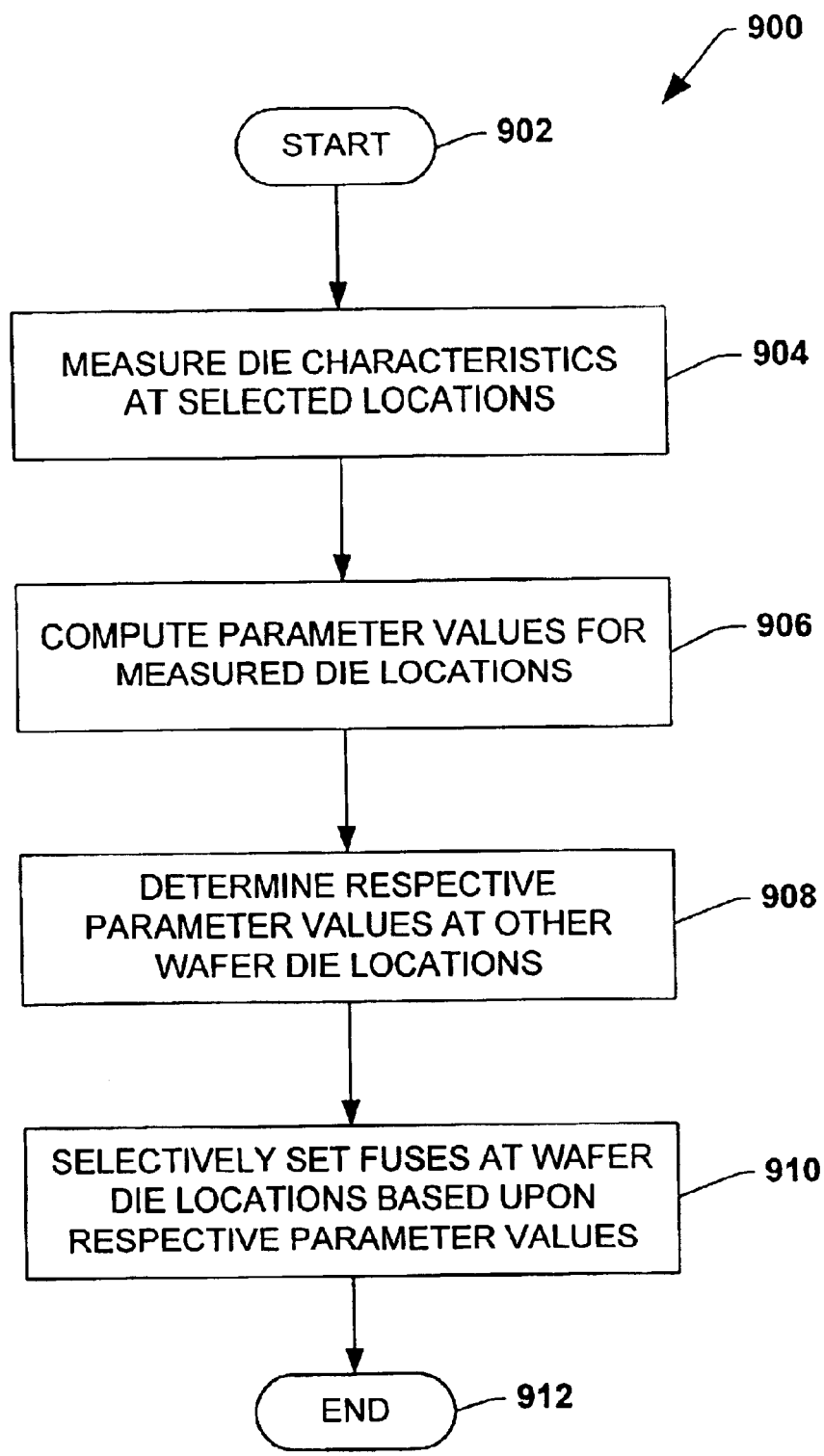
FIG. 9 is a flow diagram illustrating a methodology for use in fabricating integrated circuits in accordance with an aspect of the present invention.
Figure 10:
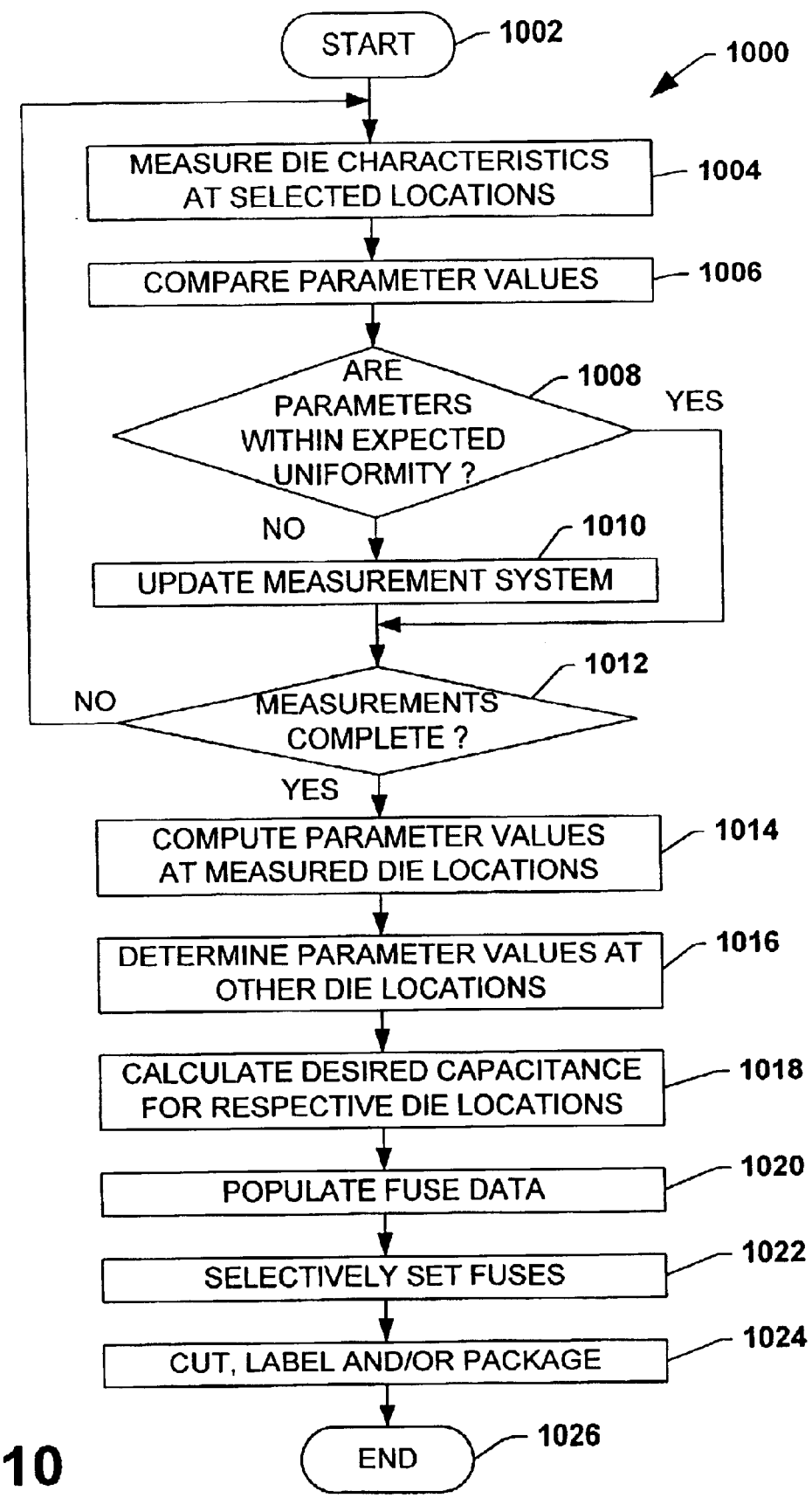
FIG. 10 is another flow diagram illustrating a methodology for use in fabricating integrated circuits in accordance with an aspect of the present invention.

In view of the structural and functional examples shown and described above, methodologies that may be implemented in accordance with the present invention will be better appreciated with reference to the flow charts of FIGS. 9 and 10. While, for purposes of simplicity of explanation, the methodologies are shown and described as a executing serially, it is to be understood and appreciated that the present invention is not limited by the order shown, as some aspects may, in accordance with the present invention, occur in different orders and/or concurrently from that shown and described herein. Moreover, not all illustrated blocks may be required to implement a methodology in accordance with the present invention. It is further to be appreciated that the methodologies or one or more aspects thereof could be implemented as hardware, software, or as a combination of hardware and software.

Turning to FIG. 9, a methodology 900 according to one or more aspects of the present invention is illustrated for selectively setting fuses to establish respective capacitance values at high impedance nodes of ICs formed within die on a wafer. The methodology begins at 902 wherein general initializations occur, such as upon activating or powering up a system to implement the methodology. Such initializations can include, for example, configuring systems, clearing buffers, allocating memory, establishing data communications, acquiring resources, and setting initial values for variables.

The methodology then proceeds to 904 wherein respective measurements are made at a plurality of spaced apart die locations of a wafer. To expedite the measurement process, the measurements can be taken for a generally uniformly distributed subset of die locations. For example, measurements can be take for about less than one-half of the die or even 1% or less of the die; although, measurements could be taken for a greater percentage of die. The measurements, for example, are obtained by electrically coupling a probe to terminals of ICs for selected die near the end of its fabrication process, such as prior to die cutting. The probe can provide test signals to measure various electrical characteristics based on the test signal(s), such as to enable determination of one or more selected parameter values.

At 906, desired parameter values are computed for respective die locations at which measurements were obtained. For example, for an IC having an analog amplifier, the parameters can include some or all of the following: sheet resistance, head resistance, impedance, capacitance density, transistor early voltage, transistor base resistance, parasitic capacitance, and transistor ft. Those skilled in the art will understand that other parameters could be computed for other types of ICs (see, e.g., Eqs. 1–6 above).

At 908, values for the parameters are determined for unmeasured die locations on the wafer. The parameters for the unmeasured die locations can be determined in a number of ways. For example, a two-dimensional interpolation can be employed to approximate parameter values based on previously computed parameter values. Alternatively, a nearest-neighbor approach could be utilized to compute parameter values for unknown die locations. Yet another approach is to derive respective signature values corresponding to a set of parameters for each die location and interpolate signature characteristics for the die locations based on the measured and unmeasured parameter values. It may be desirable to utilize parameter values for at least one measured die location in each determination of parameter values for unmeasured die locations to help improve accuracy. Those skilled in the art will understand and appreciate that various approaches exist for determining parameter values for respective die locations based on measurements taken at a selected subset of die locations according to an aspect of the present invention.

At 910, fuses are selectively set at die locations based on the parameters values at respective die locations. By way of example, the fuses are set to connect circuit components at one or more nodes for ICs in respective die. In accordance with one aspect of the present invention, the fuses are connected in series with associated capacitors to provide a parallel arrangement of capacitors. Thus, as fuses are set, capacitors can be removed from the parallel arrangement to provide a corresponding capacitance at the node (e.g., a high impedance node of an analog amplifier IC) to which the parallel capacitor arrangement is coupled. A desired capacitance for a given die site can be computed from the parameter values at that given die site. That is, the capacitance value can be one of the parameters at 906, 908 or be computed based on other parameters determined at 906, 908.

Alternatively or additionally, fuses can be associated with other impedance elements, such as inductors or resistors, as well as other types of circuit components (e.g., transistors). By way of particular example, fuses can be connected in parallel with resistors of a resistor string, so that setting a given fuse operates to modify a resistance area (e.g., based on sheet and/or head resistance for each die) and, in turn, provide a desired resistance to form the resistor string in each IC. This can be utilized to trim the gain of the amplifier in each respective IC based on the parameters measured for a subset of the die locations.

As described herein, the capacitance at a high impedance node can be used to set dominant poles and mitigate circuit instability for an analog amplifier circuit. The methodology then ends at 912, such that ICs having desired performance characteristics are provided at each respective die location. Because the capacitance area (or other electrical characteristics) can be set for ICs at each die site according to the respective parameter values associated with each such site, compensation can be tailored on a die-by-die basis. This helps avoid an overcompensation problem often associated with conventional fabrication techniques and, thus can improve performance for the ICs being produced according to an aspect of the present invention.

FIG. 10 illustrates a methodology 1000 that can be used in fabrication of an IC in accordance with an aspect of the present invention. In particular, the methodology relates to selectively setting fuses to provide capacitance values at high impedance nodes of analog amplifier circuits fabricated as ICs within die sites at spaced apart locations across a wafer. The methodology begins at 1002 wherein general initializations occur, such as upon activating or powering up a system to implement the methodology. Parameters associated with the wafer, die on the wafer, and ICs on respective die can be provided to facilitate the methodology 1000.

The methodology then proceeds to 1004 wherein respective measurements are made at a plurality of spaced apart die locations of a wafer. To expedite the measurement process, the measurements can be taken for a generally uniformly distributed set of die locations (e.g., less than one-half of the die, about 1% or less; although, measurements could be taken for a greater percentage of die). The measurements are obtained, for example, by electrically coupling one or more probes to terminals of the die, providing one or more test signals, and storing response data based on the test signals. Various electrical characteristics are measured based on the test signal(s), such as to enable computation or determination of one or more selected parameter values.

At 1006, the measurements can be compared to one another (e.g., to reveal a change in measurements or gradient across the wafer). At 1008, a decision is made as to whether the measurements fall within an expected level of uniformity. If the parameter values are above (or below) the expected uniformity level, then at 1010 a measurement system can be adjusted to increase (or decrease) the number of measurements taken and thus optimize performance of the measurements for accuracy and/or efficiency.

If at 1008 it is determined that the measurements fall within an expected level of uniformity, then the methodology proceeds to 1012. At 1012, a determination is made as to whether the measurements are complete for the wafer (e.g., have a sufficient number of measurements been taken across the wafer surface). Similarly, after the measurement system is updated at 1010, the methodology advances to 1012 to determine if the measurements are complete.

If the determination at 1012 indicates that more measurements are required for other die locations, then the methodology returns to 1004 to implement additional measurements. Alternatively, if the measurements are complete, the methodology proceeds from 1012 to 1014, in which desired parameter values are computed for respective die locations for which measurements were obtained. For example, for an IC including an analog amplifier, the parameters computed at 1014 can include some or all of the following: sheet resistance, head resistance, impedance, capacitance density, transistor early voltage, transistor base resistance, parasitic capacitance, and transistor ft. Those skilled in the art will understand that other parameters could be computed for other types of ICs.

At 1016, values for the parameters are determined for unmeasured die locations on the wafer based on the values computed at 1014. The parameters for the unmeasured die locations can be determined in a number of ways. For example, a two-dimensional interpolation can be employed to approximate parameter values based on previously computed parameter values. Alternatively, a nearest-neighbor approach could be utilized to compute parameter values for unknown die locations. Yet another approach is to derive respective signature values corresponding to a set of parameters for each die location and interpolate signature characteristics for the die locations based on the measured and unmeasured parameter values. Thus, those skilled in the art will understand and appreciate that various approaches exist for determining parameter values for respective die locations based on measurements taken at a selected subset of die locations according to an aspect of the present invention.

At 1018, desired capacitance areas are calculated for respective die locations, such as based on the capacitance density for the respective die locations. The areas are calculated, for example, to establish a desired capacitance value at respective high impedance nodes of ICs to mitigate instability and improve performance in such circuits. By way of example, the capacitance can be calculated utilizing algorithms that optimize an open loop gain and/or dominant pole location for the IC based on the parameters computed at 1014, 1016.

At 1020, fuse data is generated. For instance, a data table can be populated based, at least in part, on respective parameter and/or signature values. Additionally or alternatively, fuses can be set according to the capacitance areas determined at 1018. The table may, for instance, comprise a truth table having binary or other entries that designate which fuses to selectively set to establish desired capacitance value at high impedance nodes of respective ICs to mitigate instability in the circuits and improve performance thereof.

It is to be appreciated that in lieu of populating a truth table with specific fuse data for each die location, a predefined truth table can be selected from a plurality of predefined truth tables. For instance, the truth tables may define different levels of IC operation. As such, if parameter values indicate that a majority of die on the wafer comprise ICs that can operate aggressively, then a high level truth table may be chosen. Alternatively, if parameter values indicate that the majority of die on the wafer can only sustain a moderate level of operations, then a moderately aggressive truth table may be chosen. The predefined truth tables (or other predefined fuse setting criteria) can be selected based on the capacitance determined at 1018, based on the parameters determined at 1014, 1016, or based on a combination thereof.

At 1022, fuses are selectively set at respective die sites according to entries within the truth table to establish desired capacitance values. Fuses can be opened, for example, with a laser that pulses the fuses or by providing one or more electrical signals to set desired fuses. The particular fuses set for each die operate to configure ICs at the respective die. Thus, the fusing generally defines performance capabilities for ICs at respective die.

After fuses have been set at 1024, die can be cut, labeled and/or packaged according to performance capabilities. For example, the performance capabilities for respective die locations can be identified based on which fuses are set at 1022 for the respective die. By way of further example, die containing ICs that can operate aggressively can be labeled as such and removed from the wafer and packaged so as to warrant charging a higher price. Various levels or grades of ICs thus can be produced from a given wafer and wafer lots. The methodology then ends at 1026.

What has been described above are exemplary embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method to facilitate fabricating integrated circuits (ICs) on a wafer having a plurality of die locations comprising:
    measuring at least one respective electrical parameter at a subset of the plurality of die locations on the wafer;
    determining at least one respective parameter for unmeasured die locations on the wafer based at least in part on at least one of the measured electrical parameters associated with at least one of the subset of die locations; and
    selectively setting fuses for the plurality of die locations based on at least one of the respective electrical parameters for the respective plurality of die locations to selectively configure ICs at each respective die location.

2. The method of claim 1, the selectively setting further comprising modifying connections of circuit components in the ICs at respective die location based on which fuses are set for each respective die location.

3. The method of claim 1, further comprising:
    computing electrical component parameters for at least some of the plurality of die locations based on at least one of the parameters associated with the respective die locations;
    generating fuse data to control which fuses to set at each of the plurality of die locations based on the computed electrical component parameters; and
    selectively setting fuses at each die location based on the fuse data to provide approximately the electrical component parameter computed for each respective die location.

4. The method of claim 3, the electrical component parameter for each die location comprising an impedance.

5. The method of claim 4, the respective impedance being computed for each die locations based on the circuit configuration of the ICs so as to provide desired IC performance.

6. The method of claim 1, parameters for each respective die location corresponding to at least some of a sheet resistance of the wafer, a head resistance of the wafer, capacitance density of the wafer, a transistor early voltage, a transistor base resistance, a parasitic capacitance, and a transistor ft.

7. The method of claim 1, further comprising identifying performance capabilities of ICs at each of the plurality of die locations based on at least one the parameters associated with the each of the respective die locations.

8. The method of claim 7, further comprising packaging ICs fabricated from the wafer based on the identified performance capabilities of the respective ICs.

9. The method of claim 1, the determining further comprising interpolating to ascertain the at least one respective parameter for the unmeasured die locations.

10. A method to facilitate fabricating integrated circuits (ICs) on a wafer having a plurality of die locations comprising:
    measuring at least one respective parameter at a subset of the plurality of die locations on the wafer;
    determining at least one respective parameter for unmeasured die locations on the wafer based at least in part on at least one of the measured parameters associated with at least one of the subset of die locations;
    selectively setting fuses for the plurality of die locations based on at least one of the respective parameters for the respective plurality of die locations to selectively configure ICs at each respective die location;
    computing electrical component parameters for at least some of the plurality of die locations based on at least one of the parameters associated with the respective die locations;
    generating fuse data to control which fuses to set at each of the plurality of die locations based on the computed electrical component parameters;
    selectively setting fuses at each die location based on the fuse data to provide approximately the electrical component parameter computed for each respective die location;
    the respective impedance being computed for each die locations based on the circuit configuration of the ICs so as to provide desired IC performance; and
    the ICs at each of the plurality of die locations comprising amplifiers, the respective impedance for each die location further comprising a capacitance, at least some of the parameters for each the respective plurality of die locations indicating an open loop gain and dominant pole locations for the amplifiers, the method further comprising calculating the respective capacitance for each die location to set at least one of the open loop gain and the dominant pole locations for each respective die location.

11. The method of claim 10, the selectively setting fuses further comprising setting the capacitance at a high impedance node of each of the amplifiers of ICs at each respective die location.

12. A method to facilitate fabricating integrated circuits (ICs) on a wafer having a plurality of die locations comprising:
  measuring at least one respective parameter at a subset of the plurality of die locations on the wafer;
  determining at least one respective parameter for unmeasured die locations on the wafer based at least in part on at least one of the measured parameters associated with at least one of the subset of die locations; and
  selectively setting fuses for the plurality of die locations based on at least one of respective parameters for the respective plurality of die locations to selectively configure ICs at each respective die location;
  the determining further comprising interpolating to ascertain the at least one respective parameter for the unmeasured die locations;
  calculating respective capacitances for measured and unmeasured die locations based on at least one of the respective parameters associated with the respective measured and unmeasured die locations;
  populating a data table with fuse data to control which fuses to set to achieve the calculated capacitance for ICs at each of the respective die locations; and
  selectively setting the fuses based on the fuse data.

13. The method of claim 12 further comprising:
  ascertaining whether the measured parameters have an acceptable uniformity for the subset of die locations; and
  adjusting which of the plurality of die locations are included in the subset of die locations at which measurements are taken based on whether the measured parameter are within the acceptable range of uniformity.

14. The method of claim 13, the ICs at each of the plurality of die locations comprising an amplifier, the selectively setting fuses further comprising providing a desired capacitance for the amplifier of ICs at each respective die location.

15. The method of claim 14, the high impedance node of each of the amplifiers having a capacitance defined by a parallel arrangement of capacitors, the capacitors in the parallel arrangement connected in series with respective fuses, the selectively setting fuses further comprising removing capacitors from the parallel arrangement associated with ICs at each of the plurality of die locations, thereby establishing the respective capacitance values at the high impedance nodes of ICs at ach respective die location.

16. A manufacture of integrated circuits (ICs) fabricated on a wafer comprising:
  measuring electrical characteristics associated with at least some of a plurality of die locations on the wafer, die locations at which the electrical characteristics are not measured defining unmeasured die locations;
  computing at least one respective parameter value for at least some of the measured die locations based on at least some of the electrical characteristics measured at the respective die locations;
  determining at least one respective parameter value for at least some of the unmeasured die locations based on the at least one parameter value computed for at least one of the measured die locations; and
  selectively setting fuses at each of the plurality of die locations based on at least one of the parameter values for each respective die location to configure ICs at each respective die location.

17. The method of claim 16, the selectively setting fuses further comprising modifying connections of circuit components of the ICs at each die location based on which fuses are set at each respective die location.

18. The method of claim 17, further comprising:
  computing electrical components parameter values for the plurality of die locations based on at least one of the parameter values associated with the respective die locations;
  generating fuse data to control which fuses to set at each of the plurality of die locations based on the computed electrical components parameter values; and
  selectively setting fuses for the plurality of die locations based on the fuse data to provide approximately the electrical components parameter values computed for ICs at the respective die locations.

19. The method of claim 18, the electrical component parameter value computed for each die location comprising an impedance.

20. The method of claim 16, further comprising identifying performance capabilities of ICs at each of the plurality of die locations based on at least one of the parameter values associated with the each respective die location.

21. The method of claim 20, further comprising packaging ICs fabricated from the wafer based on the identified performance capabilities of the respective ICs.

22. The method of claim 16, further comprising labeling ICs fabricated on the wafer based on the identified performance capabilities.

23. The method of claim 16, the determining further comprising employing two-dimensional interpolation to determine the at least one respective parameter value for the unmeasured die locations.

24. A method to facilitate manufacture of integrated circuits (ICs) fabricated on a wafer comprising:
  measuring electrical characteristics associated with at least some of a plurality of die locations on the wafer, die locations at which the electrical characteristics are not measured defining unmeasured die locations;
  computing at least one respective parameter value for at least some of the measured die locations based on at least some of the electrical characteristics measured at the respective die locations;
  determining at least one respective parameter value for at least some of the unmeasured die locations based on the at least one parameter value computed for at least one of the measured die locations;
  selectively setting fuses at each of the plurality of die locations based on at least one of the parameter values for each respective die location to configure ICs at each respective die location;
  computing electrical components parameter values for the plurality of die locations based on at least one of the parameter values associated with the respective die locations;
  generating fuse data to control which fuses to set at each of the plurality of die locations based on the computed electrical components parameter values;
  selectively setting fuses for the plurality of die locations based on the fuse data to provide approximately the electrical components parameter values computed for ICs at the respective die locations;
  the electrical component parameter value computed for each die location comprising an impedance; and
  the ICs at each of the plurality of die locations comprising an amplifier, the respective impedance computed for each die location further comprising a capacitance, at least one of the parameter values for each respective die location indicating an open loop gain and a dominant pole for the respective amplifier, the method further comprising computing the respective capacitance value for each die location to set at least one of the open loop gain and the dominant pole for the amplifiers at each respective die location.

25. The method of claim 24, the selectively setting fuses further comprising providing a capacitance at a high impedance node of each of the amplifiers in ICs of each respective die location.

26. A method for compensating for variations in electrical parameters across a wafer, which variations can affect performance characteristics of integrated circuits (ICs) fabricated at a plurality of die locations on the wafer, the method comprising:

selectively setting fuses for at least a substantial portion of the plurality of die locations to configure the ICs associated with such die locations based on electrical parameters determined for each of the respective substantial portion of the plurality of die locations from measurements taken for a subset of the die locations.

27. A system that facilitates fabrication of integrated circuits (ICs) on a wafer having a plurality of die comprising:

a measurement system that measures at least one electrical parameter at a subset of the plurality of die, the subset of die being spaced apart from each other across the wafer, at least one respective parameter associated with unmeasured die being determined based at least in part on the electrical parameter measured for at least one die of the subset of die; and a fuse system that selectively sets fuses for at least a substantial portion of the plurality of die to configure respective ICs based on the parameter values at the measured and unmeasured die locations.

28. A system that facilitates fabrication of integrated circuits (ICs) on a wafer having a plurality of die comprising:

a measurement system that measures at least one parameter at a subset of the plurality of die, the subset of die being spaced apart from each other across the wafer;

at least one respective parameter associated with unmeasured die being determined based at least in part on the parameter measured for at least one die of the subset of die;

a fuse system that selectively sets fuses for at least a substantial portion of the plurality of die to configure respective ICs based on the parameter values at the measured and unmeasured die locations; and the at least one parameter including at least one of a sheet resistance, a head resistance, a capacitance density, a transistor early voltage, a transistor base resistance, a parasitic capacitance, and transistor ft.

* * * * *